United States Patent
Shin et al.

(10) Patent No.: US 12,089,386 B2
(45) Date of Patent: Sep. 10, 2024

(54) COMPOSITE MATERIAL

(71) Applicant: LG CHEM, LTD., Seoul (KR)

(72) Inventors: Jong Min Shin, Daejeon (KR); Dong Woo Yoo, Daejeon (KR); Jin Kyu Lee, Daejeon (KR)

(73) Assignee: LG Chem, LTD., Seoul (KR)

( * ) Notice: Subject to any disclaimer, the term of this patent is extended or adjusted under 35 U.S.C. 154(b) by 877 days.

(21) Appl. No.: 17/257,552

(22) PCT Filed: Sep. 30, 2019

(86) PCT No.: PCT/KR2019/012744
§ 371 (c)(1),
(2) Date: Dec. 31, 2020

(87) PCT Pub. No.: WO2020/067837
PCT Pub. Date: Apr. 2, 2020

(65) Prior Publication Data
US 2021/0289676 A1    Sep. 16, 2021

(30) Foreign Application Priority Data

Sep. 28, 2018   (KR) .................. 10-2018-0115966
Sep. 28, 2018   (KR) .................. 10-2018-0115969

(51) Int. Cl.
*H05K 9/00*   (2006.01)
*C23C 16/26*  (2006.01)

(52) U.S. Cl.
CPC ........... *H05K 9/0088* (2013.01); *C23C 16/26* (2013.01)

(58) Field of Classification Search
CPC .............. H05K 9/0088; H05K 9/0086; H05K 7/20472; C23C 16/26; C22C 2202/02; C22C 1/08; Y02E 60/10; B22F 3/1121; B22F 7/002; B32B 5/18; B32B 15/08; B32B 2307/302
See application file for complete search history.

(56) References Cited

U.S. PATENT DOCUMENTS

2010/0196778 A1   8/2010   Youn et al.
2011/0155662 A1   6/2011   Liu et al.
(Continued)

FOREIGN PATENT DOCUMENTS

CN   104789934 A   7/2015
CN   108149046 A   6/2018
(Continued)

OTHER PUBLICATIONS

International Search Report corresponding to PCT/KR2019/012744; dated Jan. 10, 2020 (6 pages, including English translation).
(Continued)

*Primary Examiner* — Andrew J. Oyer
(74) *Attorney, Agent, or Firm* — Saliwanchik, Lloyd & Eisenschenk (57) ABSTRACT

The present application relates to a composite material, a method for producing the same, and an electromagnetic-wave shielding sheet comprising the same, which can provide a composite material having excellent impact resistance and processability while having excellent heat dissipation performance, a method for producing the composite material, and an electromagnetic-wave shielding sheet.

16 Claims, 2 Drawing Sheets

(56) References Cited

U.S. PATENT DOCUMENTS

| | | | |
|---|---|---|---|
| 2014/0302305 A1* | 10/2014 | Mukherjee | C04B 35/645 |
| | | | 428/307.3 |
| 2017/0027089 A1 | 1/2017 | Geun et al. | |
| 2017/0145561 A1 | 5/2017 | Farquhar et al. | |
| 2017/0158511 A1 | 6/2017 | Braley et al. | |
| 2017/0216923 A1 | 8/2017 | Babenko et al. | |
| 2018/0077828 A1 | 3/2018 | Braley et al. | |
| 2018/0162098 A1* | 6/2018 | Joo | B32B 9/007 |
| 2020/0009658 A1 | 1/2020 | Yoo et al. | |
| 2020/0055120 A1 | 2/2020 | Yoo et al. | |
| 2020/0070248 A1 | 3/2020 | Yoo et al. | |
| 2020/0122232 A1 | 4/2020 | Yoo et al. | |
| 2020/0180030 A1 | 6/2020 | Kim et al. | |

FOREIGN PATENT DOCUMENTS

| | | |
|---|---|---|
| CN | 108394148 A | 8/2018 |
| EP | 3549700 A1 | 10/2019 |
| JP | 2017028280 A | 2/2017 |
| JP | 2017149134 A | 8/2017 |
| JP | 2018501633 A | 1/2018 |
| KR | 10-0980209 B1 | 9/2010 |
| KR | 101044163 B1 | 6/2011 |
| KR | 101337959 B1 | 12/2013 |
| KR | 1020170003808 A | 1/2017 |
| KR | 1020170029375 A | 3/2017 |
| KR | 1020170113413 A | 10/2017 |
| KR | 1020170113414 A | 10/2017 |
| KR | 1020180062170 A | 6/2018 |
| KR | 1020180062171 A | 6/2018 |
| KR | 1020180062172 A | 6/2018 |
| KR | 1020190005793 A | 1/2019 |
| WO | 2016016660 A2 | 2/2016 |

OTHER PUBLICATIONS

Extended European Search Report corresponding to EP 19864873.5; dated Jun. 18, 2021 (12 pages).

Zou, Ning, et al., "Compressive mechanical property of porous magnesium composites reinforced by carbon nanotubes", Journal of Material Science 51(11), 2016, 5232-5239.

* cited by examiner

FIG. 3

COMPOSITE MATERIAL

CROSS-REFERENCE TO RELATED APPLICATIONS

This application is a 35 U.S.C. § 371 national stage application of PCT International Application No. PCT/KR2019/012744, filed Jan. 30, 2019, which claims the benefit of priority based on Korean Patent Application No. 10-2018-0115969 filed on Sep. 28, 2018 and Korean Patent Application No. 10-2018-0115966 filed on Sep. 28, 2018, the disclosures of which are incorporated herein by reference in their entirety. The above-referenced PCT International Application was published in the Korean language as International Publication No. WO 2020/067837 on Apr. 2, 2020.

TECHNICAL FIELD

The present application relates to a composite material, a method for producing the same, and an electromagnetic wave shielding sheet comprising the same.

BACKGROUND ART

Heat-dissipating materials can be used in various applications. For example, since batteries and various electronic apparatuses generate heat during operation, a material capable of effectively controlling such heat is required.

As materials having good heat dissipation properties, ceramic materials having good thermal conductivity and the like are known, but since such materials have poor processability, a composite material produced by blending the ceramic filler or the like exhibiting high thermal conductivity in a polymer matrix can be used.

However, since a large amount of filler components must be applied in order to secure high thermal conductivity by the above method, various problems arise. For example, in the case of a material containing a large amount of filler components, the material itself tends to become hard, and in such a case, impact resistance or the like is deteriorated.

DISCLOSURE

Technical Problem

The present application is intended to provide a composite material having excellent impact resistance and processability while having excellent heat dissipation performance, and a method for producing the composite material, and also it is intended to provide an electromagnetic wave shielding sheet having good mechanical strength and flexibility while having excellent electromagnetic wave shielding ability, which is advantageous even in oxidation and high temperature stability.

Technical Solution

The present application relates to a composite material. In the present application, the term composite material may mean a material comprising a metal foam and other components. For example, the composite material may mean a material comprising the metal foam and a graphene component or a polymer component, which is described below:

In the present application, the term metal foam or metal skeleton means a porous structure comprising two or more metals as a main component. Here, the fact that the metals are used as the main component means a case where the ratio of the metals is 55 wt % or more, 60 wt % or more, 65 wt % or more, 70 wt % or more, 75 wt % or more, 80 wt % or more, 85 wt % or more, 90 wt % or more, or 95 wt % or more based on the total weight of the metal foam or the metal skeleton. The upper limit of the ratio of the metals contained as the main component is not particularly limited, which may be, for example, 100 wt %.

The term porousness may mean a case where it has a porosity of at least 30% or more, 40% or more, 50% or more, 60% or more, 70% or more, 75% or more, or 80% or more. The upper limit of the porosity is not particularly limited, which may be, for example, less than about 100%, about 99% or less, or about 98% or less or so. Here, the porosity can be calculated in a known manner by calculating the density of the metal foam or the like.

An exemplary composite material comprises a metal foam in the form of a film and a graphene component present on the surface of the metal foam or inside the metal foam. The metal foam comprises pores, and the size of the pores may be 10 μm or less on an average based on the long axis. The size of the pores may be, for example, in a range of 0.1 to 10 μm, 0.5 to 9 μm, 1 to 8 μm, or 2 to 7 μm based on the long axis. Also, in an embodiment of the present application, the graphene component may be included in a range of $10^{-5}$ to $10^{-1}$ wt % in the composite material. The weight ratio of the graphene component may be, for example, in the range of more than $10^{-5}$, less than $10^{-1}$ wt %, $5\times10^{-5}$ to $5\times10^{-2}$ wt %, $10^{-4}$ to $10^{-2}$ wt %, $5\times10^{-4}$ to $5\times10^{-3}$ wt %, $8\times10^{-4}$ to $3\times10^{-3}$ wt %. The weight ratio is a ratio when the total weight of the metal foam and the graphene component has been calculated as 100. Therefore, when another component to be described below; for example, a polymer layer is formed, the weight ratio between the metal foam and the graphene component may be in the above range. The composite material of the present application has excellent thermal conductivity characteristics, so that it can be used as a material for controlling heat, such as a heat dissipation material, and has excellent pore properties, which is provided in the form of a thin film, and has excellent impact resistance and mechanical properties.

In this specification, the average size of the pores may be, for example, an average size according to a D50 particle size analysis.

In the metal foam, 85% or more of the pores in all the pores of the metal foam may have a pore size of 10 μm or less, and the pore size of 65% or more of the pores may be 5 μm or less. Here, the lower limit of the size of the pores having a pore size of 10 μm or less or 5 μm or less is not particularly limited, but in one example, the pore size may be more than about 0 μm, 0.1 μm or more, 0.2 μm or more, 0.3 μm or more, 0.4 μm or more, 0.5 μm or more, 0.6 μm or more, 0.7 μm or more, 0.8 μm or more, 0.9 μm or more, 1 μm or more, 1.1 μm or more, 1.2 μm or more, 1.3 μm or more, 1.4 μm or more, 1.5 μm or more, 1.6 μm or more, 1.7 μm or more, 1.8 μm or more, 1.9 μm or more, or 2 μm or more.

Here, the pores having a pore size of 10 μm or less may be 100% or less, 95% or less, or 90% or less or so of all the pores, and the ratio of pores having a pore size of 5 μm or less may be 100% or less, 95% or less, 90% or less, 85% or less, 80% or less, 75% or less, or 70% or less, of all the pores.

In the present application, the desired composite material can be produced by this pore distribution or characteristic. For example, in the composite material in the form of a film, the distribution of the pores may be determined based on the long axis direction of the film.

As described above, in the composite material of the present application, the graphene component may be present on the surface of the metal foam in the form of a film or inside the metal foam. Such a graphene component may form a graphene layer on at least one surface of the metal foam or may be filled and present in voids inside the metal foam, and may also be filled inside the metal foam optionally, while forming the graphene layer. In the case of forming the graphene layer, the graphene component may form the graphene layer on at least one surface, a part of the surface, or all surfaces of the metal foam. In one example, the graphene component may form the graphene layer on at least the upper surface and/or the lower surface, which are major surfaces of the metal foam. The graphene layer may also be formed to cover the entire surface of the metal foam, or may also be formed to cover only a part of the surface. The graphene layer may have a thickness range in a range of 10 nm or less, 8 nm or less, or 5 nm or less. The lower limit is not particularly limited, but may be 0.001 nm or 0.01 nm. As the graphene component is introduced to the surface of the metal foam having the above-described specific pore size and the surface of the pores inside the metal foam in a specific content or a specific thickness, the present application can implement a graphene-deposited structure more effectively than the conventional graphene-deposited metal foam, where this structure can be implemented by the pore size, pore distribution, graphene content and/or graphene thickness. Accordingly, the metal foam of the present application provides a composite material having oxidation resistance, impact resistance or processability and excellent porosity while having excellent heat dissipation performance.

The graphene component may be grown by chemical vapor deposition (CVD) on the surface of the metal foam, without being limited thereto.

For example, the composite material may have a thermal conductivity of about 0.4 W/mK or more, 0.48 W/mK or more, 0.5 W/mK or more, 0.55 W/mK or more, 0.6 W/mK or more, 0.65 W/mK or more, 0.7 W/mK or more, 0.75 W/mK or more, 0.8 W/mK or more, 0.85 W/mK or more, 0.9 W/mK or more, 0.95 W/mK or more, 1 W/mK or more, 1.8 W/mK or more, 2 W/mK or more, 2.5 W/mK or more, 3 W/mK or more, 3.5 W/mK or more, 4 W/mK or more, 4.5 W/mK or more, or 5 W/mK or more. The higher the thermal conductivity of the composite material, the composite material may have more excellent thermal control functions, which is not particularly limited, and in one example, it may be about 100 W/mk or less, 90 W/mK or less, 80 W/mK or less, 70 W/mK or less, 60 W/mK or less, 50 W/mK or less, 40 W/mK or less, 30 W/mK or less, 20 W/mK or less, or 10 W/mk or less.

The thermal conductivity of the composite material can be measured in a manner known in the art. For example, by obtaining thermal diffusivity (A), specific heat (B), and density (C) of the composite material, the thermal conductivity can be obtained by an equation of thermal conductivity=ABC. The thermal diffusivity (A) can be measured using a laser flash method (LFA equipment, model name: LFA467), the specific heat can be measured using DSC (differential scanning calorimeter) equipment, and the density can be measured using the Archimedes method. In addition, the thermal conductivity may be a value for the thickness direction (Z axis) of the composite material.

Among physical properties mentioned in this specification, when the measured temperature affects the relevant physical property, the physical property is measured at room temperature, unless otherwise specified. The term room temperature is a natural temperature without warming or cooling, which may mean, for example, a temperature in a range of about 10° C. to about 30° C., or a temperature of about 23° C. or about 25° C. or so.

The composite material of the present application can also stably secure other physical properties such as processability or impact resistance while having such an excellent thermal conductive property and these effects can be achieved by the contents described herein.

The form of the metal foam included in the composite material is not particularly limited, but in one example, it may be in a film shape. The composite material of the present application may further comprise a polymer component present on the surface of the metal foam in the form of a film or the graphene component. In one example, the graphene component may form a graphene layer on the surface of the metal foam, and the polymer component may be formed on the graphene layer or on the surface on which the graphene component is not formed among the surfaces of the metal foam.

Such a polymer component may form a surface layer on at least one surface of the metal foam or may be filled and present in voids inside the metal foam, and may also be filled inside the metal foam optionally, while forming the surface layer. In the case of forming the surface layer, the polymer component may form the surface layer on at least one surface, a part of the surface, or all surfaces of the metal foam. In one example, the polymer component may form the surface layer on at least the upper surface and/or the lower surface, which are major surfaces of the metal foam. The surface layer may also be formed to cover the entire surface of the metal foam, or may also be formed to cover only a part of the surface.

The metal foam in the composite material may have a porosity in the range of about 10% to 99%. The metal foam having such a porosity has a porous metal skeleton forming a suitable heat transfer network, whereby it can ensure an excellent thermal conductivity even if a small amount of the relevant metal foam is applied. In another example, the porosity may be 15% or more, 20% or more, 25% or more, 30% or more, 35% or more, 40% or more, 45% or more, 50% or more, or 55% or more, or may be 98% or less, 95% or less, 90% or less, 88% or less, 85% or less, 83% or less, 80% or less, 78% or less, 75% or less, 73% or less, or 71% or less.

As described above, the metal foam may be in the form of a film. In this case, the thickness of the film can be adjusted in consideration of the desired thermal conductivity or thickness ratio, and the like, in manufacturing a composite material according to a method to be described below: In order to ensure the target thermal conductivity, the thickness of the film may be, for example, about 10 μm or more, about 20 μm or more, about 30 μm or more, about 40 μm or more, about 45 μm or more, about 50 μm or more, about 55 μm or more, about 60 μm or more, about 65 μm or more, or about 70 μm or more. The upper limit of the thickness of the film is controlled according to the purpose, which is not particularly limited, but may be, for example, about 1,000 μm or less, about 900 μm or less, about 800 μm or less, about 700 μm or less, about 600 μm or less, about 500 μm or less, about 400 μm or less, about 300 μm or less, about 200 μm or less, or about 150 μm or less or so.

In this specification, when the thickness of the relevant target is not constant, the thickness may be a minimum thickness, a maximum thickness or an average thickness of the target.

The metal foam may be a material having high thermal conductivity. In one example, the metal foam may comprise or consist of a metal or a metal alloy having thermal conductivity of about 8 W/mK or more, about 10 W/mK or more, about 15 W/mK or more, about 20 W/mK or more, about 25 W/mK or more, about 25 W/mK or more, about 30 W/mK or more, about 35 W/mK or more, about 40 W/mK or more, about 45 W/mK or more, about 50 W/mK or more, about 60 W/mK or more, about 70 W/mK or more, about 75 W/mK or more, about 80 W/mK or more, about 85 W/mK or more, or about 90 W/mK or more. The thermal conductivity is not particularly limited, which may be, for example, about 1,000 W/mk or less or so, because the higher the numerical value, the desired thermal control characteristics can be ensured while applying a small amount of the metal foam.

The skeleton of the metal foam may be composed of various kinds of metals or metal alloys, where a material capable of exhibiting thermal conductivity in the above-mentioned range may be selected from these metals or metal alloys. Such a material can be exemplified by any metal selected from the group consisting of copper, gold, silver, aluminum, nickel, iron, cobalt, magnesium, molybdenum, tungsten and zinc, or an alloy of two or more thereof, and the like, but is not limited thereto.

Such metal foams are variously known, and methods for producing metal foams are also variously known. In the present application, such a known metal foam or the metal foam produced by the known method may be applied.

As a method for producing a metal foam, a method of sintering a pore-forming agent such as a salt and a composite material of a metal, a method of coating a metal on a support such as a polymer foam and sintering in that state, a slurry method, and the like is known. Furthermore, the metal foam can also be produced by a method disclosed in Korean Patent Application No. 2017-0086014, 2017-0040971, 2017-0040972, 2016-0162154, 2016-0162153 or 2016-0162152, and the like, which is a prior application of the present applicant.

The metal foam may also be produced by the induction heating method, among the methods disclosed in the prior applications, where the metal foam may comprise at least a conductive magnetic metal. In this case, the metal foam may comprise the conductive magnetic metal in an amount of 30 wt % or more, 35 wt % or more, 40 wt % or more, 45 wt % or more, or 50 wt % or more on the basis of weight. In another example, the ratio of the conductive magnetic metal in the metal foam may be about 55 wt % or more, 60 wt % or more, 65 wt % or more, 70 wt % or more, 75 wt % or more, 80 wt % or more, 85 wt % or more, or 90 wt % or more. The upper limit of the ratio of the conductive magnetic metal is not particularly limited, which may be, for example, less than about 100 wt % or 95 wt % or less.

In the present application, the term conductive magnetic metal is a metal having predetermined relative magnetic permeability and conductivity, which may mean a metal capable of generating heat to such an extent that the metal can be sintered by the induction heating method.

The kind of the polymer component included in the composite material of the present application is not particularly limited, which may be selected in consideration of, for example, processability, impact resistance, insulation properties or the like of the composite material. An example of the polymer component applicable in the present application may include one or more selected from the group consisting of a known acrylic resin, silicone resin, epoxy resin, urethane resin, amino resin and phenol resin, but is not limited thereto.

In the case of the composite material, it is possible to secure excellent thermal conductivity while minimizing the ratio of components securing the thermal conductivity mainly through the application of the above-described metal foam, thereby securing the desired physical properties without damaging processability or impact resistance, and the like.

The present application also relates to a method for producing a composite material in the above type. The production method may comprise, for example, forming a graphene component on the surface of or inside the metal foam in the form of a film.

Generally, the graphene component can be grown by applying a carbon source and heat to a support comprising a metal catalyst, as a chemical vapor deposition method. In the present application, the metal foam may be used as the support. As the carbon source, one selected from the group consisting of carbon monoxide, carbon dioxide, methane, ethane, ethylene, ethanol, acetylene, propane, butane, butadiene, pentane, pentene, cyclopentadiene, hexane, cyclohexane, benzene, toluene and a combination thereof can be used. For example, when the carbon source is heat-treated at a temperature of 300° C. to 2000° C. while being supplied in a gaseous phase and then cooled, the carbon components present in the carbon source may be bonded to grow on the surface of the metal foam.

The kind of such a chemical vapor deposition (CVD) method includes high temperature chemical vapor deposition (HTCVD), inductively coupled plasma chemical vapor deposition (ICP-CVD), low pressure chemical vapor deposition (LPCVD), atmospheric pressure chemical vapor deposition (APCVD), metal organic chemical vapor deposition (MOCVD) or plasma-enhanced chemical vapor deposition (PECVD), and the like.

The production method of the present application may comprise a step of producing a metal foam before the step of forming a graphene component.

The method for producing a metal foam may comprise a step of sintering a green structure including a metal component having a metal. In the present application, the term green structure means a structure before undergoing a process performed to form a metal foam, such as the sintering, that is, a structure before a metal foam is produced. In addition, even if the green structure is referred to as a porous green structure, it is not necessarily porous by itself, and it can be referred to as a porous green structure for convenience, as long as it can finally form a metal foam, which is a porous metal structure.

In the present application, the green structure may be formed using a slurry including at least a metal component, a dispersant and a binder.

In one example, the metal component may comprise at least a metal having appropriate relative magnetic permeability and conductivity. According to one example of the present application, when the induction heating method is applied as the sintering, the application of such a metal can be made to perform the sintering according to the relevant method smoothly.

The metal component may comprise a second metal different from the above-described conductive magnetic metal together with the metal. In this case, the metal foam may be formed of a metal alloy. As the second metal, a metal having relative magnetic permeability and/or conductivity in the same range as that of the above-mentioned conductive magnetic metal may also be used, and a metal having relative magnetic permeability and/or conductivity outside such a range may be used. In addition, as the second metal, one metal may also be included and two or more metals may also be included. The kind of such a second metal is not particularly limited as long as it is different from the conductive magnetic metal to be applied, and for example, one or more metals, which are different from the conductive magnetic metal, in copper, phosphorus, molybdenum, zinc, manganese, chromium, indium, tin, silver, platinum, gold, aluminum, stainless steel, or magnesium, and the like, may be applied, without being limited thereto.

The metal component forming the green structure may be in the form of powder. For example, the metals in the metal component may have an average particle diameter in a range of about 0.1 µm to about 200 µm. In another example, the average particle diameter may be about 0.5 µm or more, about 1 µm or more, about 2 µm or more, about 3 µm or more, about 4 µm or more, about 5 µm or more, about 6 µm or more, about 7 µm or more, or about 8 µm or more. In another example, the average particle diameter may be about 150 µm or less, 100 µm or less, 90 µm or less, 80 µm or less, 70 µm or less, 60 µm or less, 50 µm or less, 40 µm or less, 30 µm or less, or 20 µm or less. As the metal in the metal component, those having different average particle diameters may be applied. The average particle diameter can be appropriately selected in consideration of the shape of the desired metal foam, for example, the thickness or the porosity of the metal foam, which is not particularly limited.

The green structure may be formed using a slurry comprising a dispersant and a binder together with the metal component including the metal.

The ratio of the metal component in the above slurry is not particularly limited, which may be selected in consideration of the desired viscosity or process efficiency, and the like. In one example, the ratio of the metal component in the slurry may be about 10 to 70% or so on the basis of weight, but is not limited thereto.

Here, as the dispersant, for example, an alcohol may be applied. As the alcohol, a monohydric alcohol with 1 to 20 carbon atoms such as methanol, ethanol, propanol, pentanol, octanol, ethylene glycol, propylene glycol, pentanol, 2-methoxyethanol, 2-ethoxyethanol, 2-butoxyethanol, glycerol, texanol or terpineol, or a dihydric alcohol with 1 to 20 carbon atoms such as ethylene glycol, propylene glycol, hexanediol, octanediol or pentanediol, or a higher polyhydric alcohol, and the like may be used, but the kind is not limited to the above.

The slurry may further comprise a binder. The kind of such a binder is not particularly limited, which may be appropriately selected depending on the kind of the metal component or dispersant, and the like applied upon producing the slurry. For example, the binder can be exemplified by an alkylcellulose having an alkyl group with 1 to 8 carbon atoms such as methylcellulose or ethylcellulose, a polyalkylene carbonate having an alkylene unit with 1 to 8 carbon atoms such as polypropylene carbonate or polyethylene carbonate, or a polyvinyl alcohol-based binder such as polyvinyl alcohol or polyvinyl acetate, and the like, but is not limited thereto.

The ratio of each component in such a slurry is not specifically limited. Such a ratio may be adjusted in consideration of process efficiency such as coating properties or moldability at the time of performing the process using a slurry.

For example, in the slurry, the binder may be contained in a ratio of about 5 to 500 parts by weight relative to 100 parts by weight of the above-described metal component. In another example, the ratio may be about 10 parts by weight or more, about 20 parts by weight or more, about 30 parts by weight or more, about 40 parts by weight or more, about 50 parts by weight or more, about 60 parts by weight or more, about 70 parts by weight or more, about 80 parts by weight or more, about 90 parts by weight or more, about 100 parts by weight or more, about 110 parts by weight or more, about 120 parts by weight or more, about 130 parts by weight or more, about 140 parts by weight or more, about 150 parts by weight or more, about 200 parts by weight or more, or about 250 parts by weight or more, and may be about 450 parts by weight or less, about 400 parts by weight or less, or about 350 parts by weight or less.

In addition, the dispersant in the slurry may be included in a ratio of about 500 to 2,000 parts by weight relative to 100 parts by weight of the binder. In another example, the ratio may be about 200 parts by weight or more, about 300 parts by weight or more, about 400 parts by weight or more, about 500 parts by weight or more, about 550 parts by weight or more, about 600 parts by weight or more, or about 650 parts by weight or more, and may be about 1,800 parts by weight or less, about 1,600 parts by weight or less, about 1,400 parts by weight or less, about 1,200 parts by weight or less, or about 1,000 parts by weight or less.

In this specification, the unit weight part means a weight ratio between the respective components, unless otherwise specified.

The slurry may further comprise a solvent, if necessary. As the solvent, an appropriate solvent may be used in consideration of the solubility of components of the slurry, for example, the metal component or the binder, and the like. For example, as the solvent, one having a dielectric constant in a range of about 10 to 120 can be used. In another example, the dielectric constant may be about 20 or more, about 30 or more, about 40 or more, about 50 or more, about 60 or more, or about 70 or more, or may be about 110 or less, about 100 or less, or about 90 or less. Such a solvent can be exemplified by water or an alcohol with 1 to 8 carbon atoms such as ethanol, butanol or methanol, DMSO (dimethyl sulfoxide), DMF (dimethylformamide) or NMP (N-methylpyrrolidinone), and the like, but is not limited thereto.

When a solvent is applied, it may be present in the slurry in a ratio of about 50 to 400 parts by weight relative to 100 parts by weight of the binder, but is not limited thereto.

The slurry may also comprise known additives, which are additionally required, in addition to the above-mentioned components.

The method of forming the green structure using the slurry as above is not particularly limited. In the field of manufacturing metal foams, various methods for forming green structures are known, and in the present application, all these methods can be applied. For example, the green structure can be formed by maintaining the slurry in a suitable template, or by coating the slurry in an appropriate manner.

The metal foams have generally brittle characteristics due to their porous structural features, thereby being difficultly manufactured in the form of films or sheets, particularly thin films or sheets and having a problem of being easily broken even when they are manufactured. However, according to the method of the present application, it is possible to form a metal foam, in which pores having a predetermined size are uniformly formed therein, while having a thin thickness, and having excellent mechanical characteristics.

The green structure formed by such a method may be sintered to produce a metal foam. In this case, the method of performing the sintering for producing the metal foam is not particularly limited, and a known sintering method can be applied. That is, the sintering can be performed in such a manner that an appropriate amount of heat is applied to the green structure in an appropriate manner.

In this case, the temperature of the heat source may be in a range of 100° C. to 1200° C. The production method of the present application may further comprise a step of curing a curable polymer composition in a state where the polymer composition is present on the surface of or inside the metal foam in the form of a film.

The details of the metal foams applied in the above method are as described above, and specific matters of the composite material to be manufactured can also follow the above-described contents.

On the other hand, the polymer composition applied in the above is not particularly limited as long as it can form the above-mentioned polymer component through curing or the like, and such polymer components are variously known in the art.

That is, for example, the composite material can be prepared by performing the curing through a known method using a material having appropriate viscosity among known components.

The present application also relates to an electromagnetic wave shielding sheet.

There are various problems caused by electromagnetic waves generated in various electronic devices. The electromagnetic waves emitted to the outside have a bad influence on health, as well as cause signal disturbance or malfunction problems for the electronic device itself or other devices including the electronic device. The present application can provide the electromagnetic wave shielding sheet, thereby providing an electromagnetic wave shielding sheet having good mechanical strength and flexibility while having excellent electromagnetic wave shielding ability, which is advantageous even in oxidation and high temperature stability.

In one example, the electromagnetic wave shielding sheet may comprise the above-described composite material. By unique surface area and pore characteristics of the metal foam, the electromagnetic wave shielding film can repetitively reflect and absorb electromagnetic waves incident on the internal pores, thereby effectively extinguishing the electromagnetic waves. In addition, the metal foam can be applied to ensure excellent mechanical strength and flexibility, and the complexation with the polymer component can also solve oxidization and high temperature stability or peeling problems generated at the time of being included in the device, and the like.

In one example, the electromagnetic wave shielding sheet comprises a metal foam in the form of a film and a graphene component present on the surface of the metal foam or inside the metal foam, and the metal foam comprises pores, where the size of the pores may be 10 μm or less on an average based on the long axis. Also, in an embodiment of the present application, the graphene component may be included in a range of $10^{-5}$ to $10^{-1}$ wt % in the composite material. The weight ratio of the graphene component may be, for example, in the range of more than $10^{-5}$, less than $10^{-1}$ wt %, $5\times10^{-5}$ to $5\times10^{-2}$ wt %, 104 to $10^{-2}$ wt %, $5\times10^{-4}$ to $5\times10^{-3}$ wt %, $8\times10^{-4}$ to $3\times10^{-3}$ wt %. The electromagnetic wave shielding sheet of the present application forms a graphene component on the metal foam having the pore size, thereby increasing the effect by reflection, or multiple reflection and absorption effects, whereby it is possible to maximize high shielding efficiency up to a high-frequency region.

The present application also relates to a method for producing an electromagnetic wave shielding sheet in the above type. The production method may comprise, for example, forming a graphene component on the surface of or inside the metal foam in the form of a film.

Advantageous Effects

The present application can provide a composite material having excellent impact resistance and processability while having excellent heat dissipation performance, and a method for producing the composite material.

BEST MODE

Hereinafter, the present application will be described in detail with reference to examples and comparative examples, but the scope of the present application is not limited to the following examples.

Example 1

The metal foam was a copper metal foam, where the copper foam in a film shape with a thickness of about 80 μm or so, an average pore size of 5 μm and a porosity of about 70% was used. In order to remove the oxide film on the surface of the copper foam, it was heated to 1000° C. in the presence of reducing gas ($H_2$) for 2 hours. Thereafter, $CH_4$ gas was injected and heated at 1000° C. for 6 hours to deposit graphene. It was confirmed through Raman analysis whether or not the graphene was deposited.

The graphene-deposited copper foam as produced above was immersed in a thermosetting resin (Dow Corning, PDMS, Sylgard 527 kit) solution, and then extruded to a thickness of 100 μm using a film applicator to remove an excessive amount of the resin. Thereafter, it was cured in an oven at 120° C. for 2 hours to produce a composite material having a thickness of 100 μm.

Example 2

A composite material was produced in the same manner as in Example 1, except that the thickness of the copper foam was 100 μm and the final composite material was produced to have a thickness of about 120 μm or so.

Example 3

A composite material was produced in the same manner as in Example 1, except that the thickness of the copper foam was 120 μm and the final composite material was produced to have a thickness of about 140 μm or so.

Example 4

A composite material was produced in the same manner as in Example 2, except that the metal foam was produced to have a porosity of about 60% or so.

Example 5

A composite material was produced in the same manner as in Example 2, except that the metal foam was produced to have a porosity of about 50% or so.

Example 6

Figure 1:
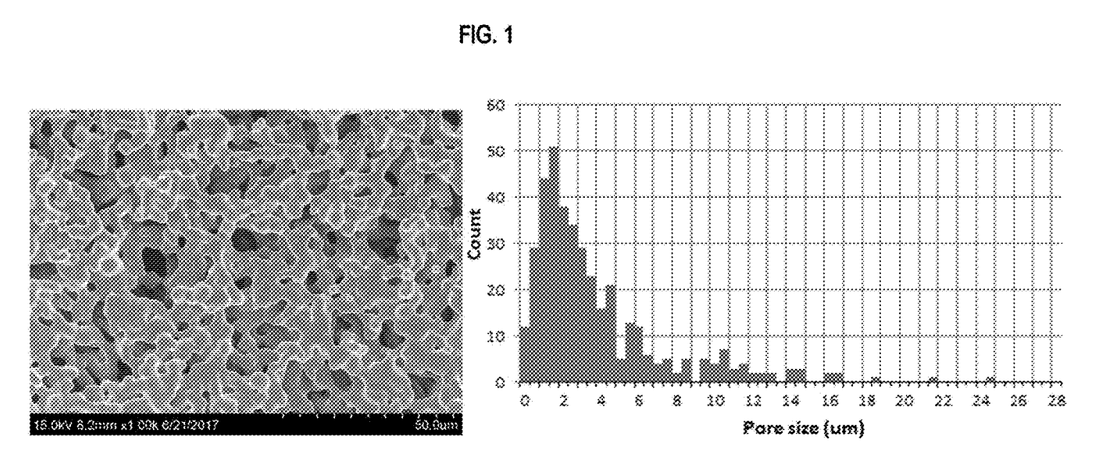
FIGS. 1 and 2 are SEM images of metal foams according to Examples 6 and 7.

The metal foam was a copper metal foam, where the copper foam in a film shape with a thickness of about 90 μm or so and a porosity of about 62% was used. FIG. 1 shows an SEM image (left) and a pore size distribution graph (right) of the metal foam according to Example 6.

The copper foam was reduced at 1000° C. for 1 hour under $H_2$ atmosphere. Thereafter, the partial pressure of the gas was changed to $H_2/CH_4$=15/50 to grow graphene at 1000° C. for 20 minutes, and while the temperature was gradually lowered to room temperature under $H_2$ atmosphere, the graphene-deposited copper foam was formed to produce an electromagnetic wave shielding sheet according to the present application.

Example 7

Figure 2:
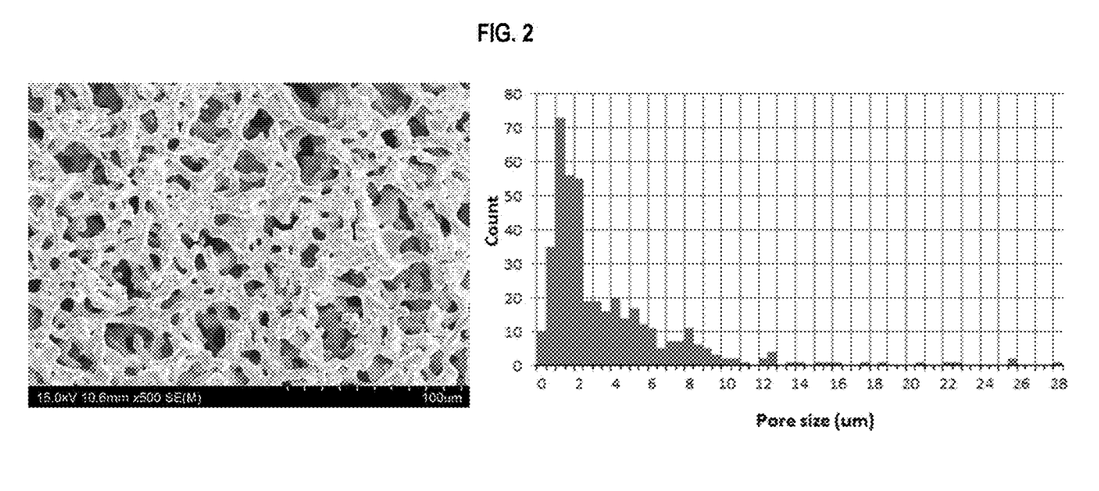

An electromagnetic wave shielding sheet was produced in the same manner as in Example 6, except that the metal foam was a copper metal foam, where the copper foam in a film shape with a thickness of about 100 μm or so and a porosity of about 65% was used. FIG. 2 shows an SEM image (left) and a pore size distribution graph (right) of the metal foam according to Example 7.

Comparative Example 1

After a copper filler was mixed with a PDMS resin as a metal filler, the mixture was molded using a film applicator into the form of a film having a thickness of about 120 μm or so and cured to produce a composite material in the form of a film.

Comparative Example 2

After a graphite filler was mixed with a PDMS resin as a metal filler, the mixture was molded using a film applicator into the form of a film having a thickness of about 120 μm or so and cured to produce a composite material in the form of a film.

Comparative Example 3

After a CNT filler was mixed with a PDMS resin as a metal filler, the mixture was molded using a film applicator into the form of a film having a thickness of about 120 μm or so and cured to produce a composite material in the form of a film.

Comparative Example 4

A copper foam was produced by plating copper on a polyurethane foam and then baking it at high temperature to remove the polyurethane. The produced copper foam had an average pore size of 450 μm, a porosity of 95% or more and a thickness of 1.6 mm.

A composite material was produced by depositing graphene on the copper foam in the form of a film in the same manner as in Example 1.

Comparative Example 5

A composite material was produced in the same manner as in Comparative Example 4, except for depositing no graphene.

Comparative Example 6

A composite material was produced in the same manner as in Example 2, except for forming no graphene.

Comparative Example 7

An electromagnetic wave shielding sheet was produced in the same manner as in Example 6, except for depositing no graphene.

Experimental Example 1—Thermal Conductivity Measurement

By obtaining thermal diffusivity (A), specific heat (B), and density (C) of the composite material, the thermal conductivity of each composite material produced according to Examples and Comparative Examples was obtained by an equation of thermal conductivity=ABC, where the thermal diffusivity (A) was measured using a laser flash method (LFA equipment, model name: LFA467), the specific heat was measured using DSC (differential scanning calorimeter) equipment, and the density was measured using the Archimedes method. In addition, the thermal conductivity is a value for the thickness direction (Z axis) of the composite material.

TABLE 1

|  | Thermal conductivity (W/mK) | Remarks |
|---|---|---|
| Example 1 | 5.11 | — |
| Example 2 | 5.16 | — |
| Example 3 | 5.01 | — |
| Example 4 | 5.55 | — |
| Example 5 | 5.87 | — |
| Comparative Example 1 | 0.37 | — |
| Comparative Example 2 | 0.34 | — |
| Comparative Example 3 | 0.47 | — |
| Comparative Example 4 | 1.77 | — |
| Comparative Example 5 | 1.71 | — |
| Comparative Example 6 | 3.41 | — |

Figure 3:
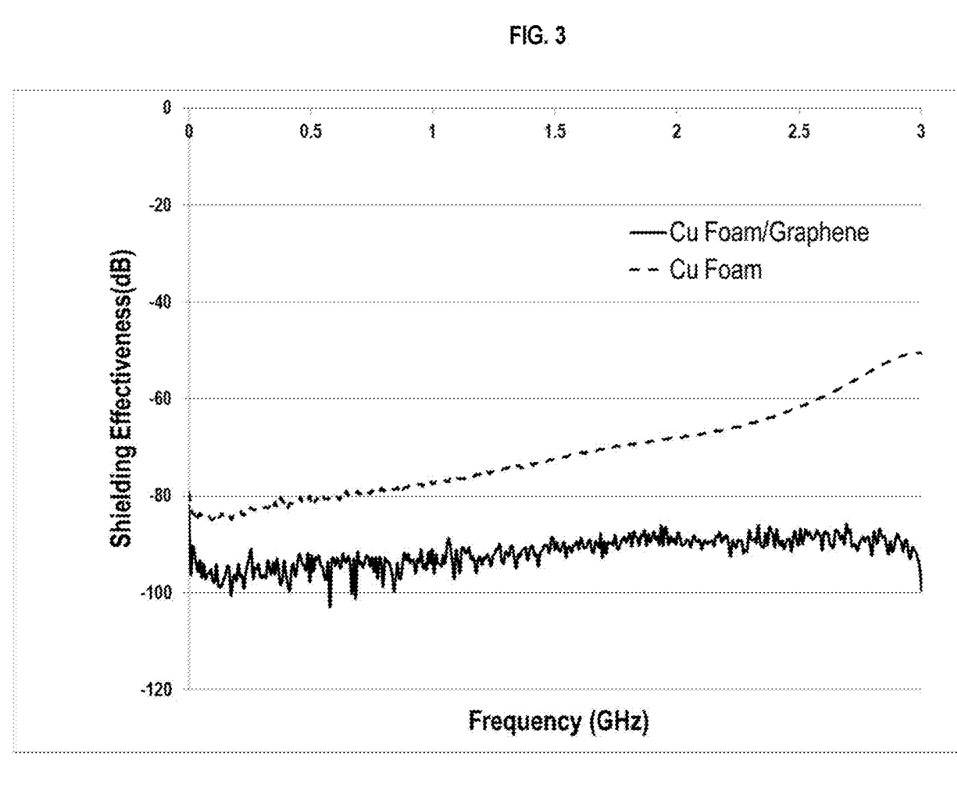
FIG. 3 is a graph showing electromagnetic wave shielding efficiency of Example 6 and Comparative Example 7.

Experimental Example 2—Measurement of Electromagnetic Wave Shielding Efficiency For each electromagnetic wave shielding sheet produced in Examples 6 and 7, and Comparative Example 7, the electromagnetic wave shielding efficiency was measured using an electromagnetic wave shielding efficiency measuring apparatus from Keycom. FIG. 3 showed the results of measuring the shielding efficiency from 300 MHz to 3 GHz for Example 6 (graphene-deposited copper foam) and Comparative Example 7 (copper foam without graphene deposition). In the case of Comparative Example, as shown in FIG. 3, the shielding efficiency decreased as the frequency was increased, whereas in the case of Example 6, it reached 100 dB as the instrument measurement limit.

What is claimed is:

1. A composite material comprising a metal foam in the form of a film and a graphene component present on a surface of the metal foam or inside the metal foam,
   wherein the metal foam comprises pores, the pores having a size of 10 μm or less on average based on a long axis of each of the pores, and
   wherein the metal foam has a porosity in a range of 50% to 99%.

2. The composite material according to claim 1, wherein the graphene component is included in a range of $10^{-5}$ to $10^{-1}$ wt % in the composite material.

3. The composite material according to claim 1, wherein the metal foam has a thickness in a range of 10 μm to 1000 μm.

4. The composite material according to claim 1, wherein the metal foam comprises a metal or a metal alloy having a thermal conductivity of 8 W/mK or greater.

5. The composite material according to claim 1, wherein the metal foam comprises one or more metals or metal alloys selected from the group consisting of iron, cobalt, nickel, copper, phosphorus, molybdenum, zinc, manganese, chromium, indium, tin, silver, platinum, gold, aluminum, stainless steel and magnesium.

6. The composite material according to claim 1, further comprising a polymer component present on the surface of the metal foam or on the graphene component.

7. The composite material according to claim 6, wherein the polymer component forms a surface layer on the surface of the metal foam or on the graphene component.

8. The composite material according to claim 6, wherein the polymer component comprises one or more resins selected from the group consisting of an acrylic resin, a silicone resin, an epoxy resin, a urethane resin, an amino resin and a phenol resin.

9. The composite material according to claim 1, wherein the graphene component forms a graphene layer on the surface of the metal foam or inside the metal foam.

10. The composite material according to claim 9, wherein the graphene layer has a thickness in a range of 10 nm or less.

11. The composite material according to claim 1, wherein the composite material has a thermal conductivity of about 0.4 W/mK or greater.

12. An electromagnetic wave shielding sheet comprising a metal foam in the form of a sheet and a graphene component present on a surface of the metal foam or inside the metal foam,
    wherein the metal foam comprises pores, the pores having a size of 10 μm or less on average based on a long axis of each of the pores, and
    wherein the metal foam has a porosity in a range of 50% to 99%.

13. The electromagnetic wave shielding sheet according to claim 12, wherein the graphene component is included in a range of $10^{-5}$ to $10^{-1}$ wt % in the sheet.

14. A method for producing the composite material according to claim 1, the method comprising:
    providing the metal foam; and
    forming the graphene component on the surface of or inside the metal foam in the form of a film.

15. The method of claim 14, wherein said forming is carried out by chemical vapor deposition (CVD) of the graphene component on the surface of the metal foam or inside the metal foam.

16. The method of claim 15, wherein the chemical vapor deposition (CVD) comprises high temperature chemical vapor deposition (HTCVD), inductively coupled plasma chemical vapor deposition (ICP-CVD), low pressure chemical vapor deposition (LPCVD), atmospheric pressure chemical vapor deposition (APCVD), metal organic chemical vapor deposition (MOCVD) or plasma-enhanced chemical vapor deposition (PECVD).

* * * * *